United States Patent
Krehbiel et al.

(10) Patent No.: US 9,350,316 B1
(45) Date of Patent: May 24, 2016

(54) WIDEBAND BALUNS AND METHODS OF THEIR MANUFACTURE

(71) Applicants: James B. Krehbiel, Tempe, AZ (US); Abdulrhman M. S Ahmed, Gilbert, AZ (US); Joseph Staudinger, Gilbert, AZ (US)

(72) Inventors: James B. Krehbiel, Tempe, AZ (US); Abdulrhman M. S Ahmed, Gilbert, AZ (US); Joseph Staudinger, Gilbert, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/574,008

(22) Filed: Dec. 17, 2014

(51) Int. Cl.
| | |
|---|---|
| *H03H 7/42* | (2006.01) |
| *H01F 5/00* | (2006.01) |
| *H01F 41/04* | (2006.01) |
| *H03F 3/19* | (2006.01) |
| *H03F 3/217* | (2006.01) |
| *H03H 3/00* | (2006.01) |
| *H01P 1/10* | (2006.01) |

(52) U.S. Cl.
CPC ............... *H03H 7/42* (2013.01); *H01F 5/003* (2013.01); *H01F 41/04* (2013.01); *H03F 3/19* (2013.01); *H03F 3/217* (2013.01); *H03H 3/00* (2013.01); *H03F 2200/06* (2013.01); *H03F 2200/451* (2013.01)

(58) Field of Classification Search
CPC ............. H03H 7/42; H03H 7/422; H01P 3/08
USPC ................................................ 333/25, 26, 238
See application file for complete search history.

(56) References Cited

U.S. PATENT DOCUMENTS

| | | | | |
|---|---|---|---|---|
| 5,497,137 | A * | 3/1996 | Fujiki | H01F 17/0006 333/26 |
| 6,483,415 | B1 * | 11/2002 | Tang | H01F 17/0013 333/26 |
| 6,628,189 | B2 * | 9/2003 | Yazaki | H01F 17/0013 333/25 |
| 7,215,217 | B2 | 5/2007 | Ezzeddine | |
| 7,274,268 | B2 | 9/2007 | Vice et al. | |
| 7,656,247 | B2 | 2/2010 | Kaehs | |

OTHER PUBLICATIONS

Ercoli, Mariano et al.; "Design of an ultra small passive balun in CMOS 65 nm technology for 60 GHz applications"; Analog Integrated Circuits Signal Processing; Jun. 10, 2012; 73; pp. 741-748; Springer Science+Business Media, LLC.

* cited by examiner

Primary Examiner — Dean Takaoka

(57) ABSTRACT

A balun structure comprises an unbalanced input terminal, a first planar coil connected to the unbalanced input terminal, a second planar coil connected to the first planar coil, a third planar coil stacked in relation to the first planar coil, a first balanced output terminal connected to the third planar coil, a fourth planar coil stacked in relation to the second planar coil, and a second balanced output terminal connected to the fourth planar coil, wherein a first length of the first planar coil and a third length of the third planar coil differ by one twelfth to one twentieth of an operational wavelength and a second length of the second planar coil and a fourth length of the fourth planar coil differ by one twelfth to one twentieth of the operational wavelength.

20 Claims, 4 Drawing Sheets

US 9,350,316 B1

WIDEBAND BALUNS AND METHODS OF THEIR MANUFACTURE

BACKGROUND

1. Field of the Disclosure

The present disclosure relates generally to radio frequency (RF) circuits and, more particularly, to baluns.

2. Background

The word "balun" is a portmanteau derived from the words "balanced" and "unbalanced" and refers to a circuit for efficiently coupling a signal either from a balanced circuit element to an unbalanced circuit element or from an unbalanced circuit element to a balanced circuit element. A balanced circuit element conveys the signal, as signal portions of different phases, along conductors with reference to each other. An unbalanced circuit element conveys the signal along a path referenced to a ground potential. A balun covering a wide frequency range is difficult to realize, as imperfections, such as parasitic reactances, can impair the performance of a balun.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A balun structure includes an unbalanced input terminal, a first planar coil connected to the unbalanced input terminal, a second planar coil connected to the first planar coil, a third planar coil stacked in relation to the first planar coil, a first balanced output terminal connected to the third planar coil, a fourth planar coil stacked in relation to the second planar coil, and a second balanced output terminal connected to the fourth planar coil. A first length of the first planar coil and a third length of the third planar coil differ by one twelfth to one twentieth of an operational wavelength. A second length of the second planar coil and a fourth length of the fourth planar coil differ by one twelfth to one twentieth of the operational wavelength.

Figure 1:
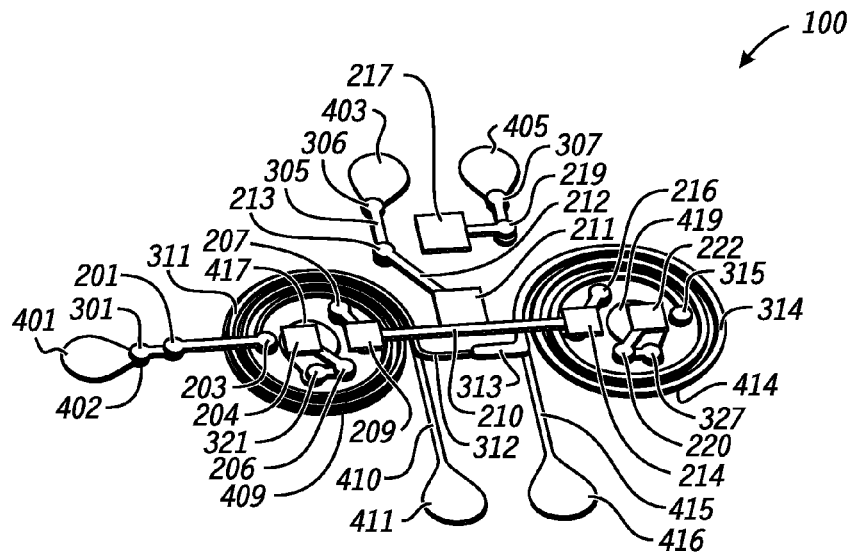
FIG. 1 is a perspective view drawing illustrating a balun in accordance with an embodiment.

FIG. 1 is a perspective view drawing illustrating a balun in accordance with an embodiment. Balun 100 of FIG. 1 is fabricated from planar conductive layer 200 of FIG. 2, planar conductive layer 300 of FIG. 3, and planar conductive layer 400 of FIG. 4. Vias provide interconnection between layers. To avoid obscuring the relationships between planar conductive layers 200, 300, and 400, FIG. 1 does not show the planar dielectric layers separating planar conductive layers 200, 300, and 400. The relationships between the planar conductive layers and the planar dielectric layers can be seen in FIG. 5. While a specific number of planar conductive layers and planar dielectric layers are illustrated, other embodiments can be practiced with other numbers of layers. While some reference numerals are shown in FIG. 1, description of those and other reference numerals is provided below with reference to FIGS. 2, 3, and 4.

Figure 2:
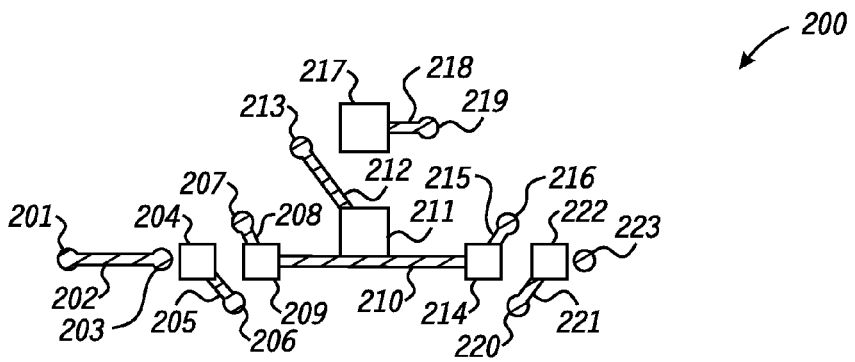
FIG. 2 is a plan view drawing illustrating a first layer of the balun of FIG. 1 in accordance with an embodiment.

FIG. 2 is a plan view drawing illustrating a first layer of the balun of FIG. 1 in accordance with an embodiment. In a planar conductive layer 200, a plurality of conductive features defined as described below. Via 201 is connected to via 303 of FIG. 3. Via 201 is connected to path 202. Path 202 is connected to via 203. Via 203 is connected to via 310 of FIG. 3. Pad 204 is connected to path 205. Path 205 is connected to via 206. Via 206 is connected to via 319 of FIG. 3. Via 207 is connected to path 208 and to via 316 of FIG. 3. Path 208 is connected to pad 209. Pad 209 is connected to path 210, to via 318 of FIG. 3, and to via 407 of FIG. 4. Path 210 lies adjacent to and is connected to pad 211 and is also connected to pad 214. Pad 211 is connected to path 212. Path 212 is connected to via 213. Via 213 is connected to via 306 of FIG. 3. Pad 214 is connected to path 215, to via 324 of FIG. 3, and to via 412 of FIG. 4. Path 215 is connected to via 216. Via 216 is connected to via 322 of FIG. 3. Pad 217 is connected to path 218. Path 218 is connected to via 219. Via 219 is connected to via 309 of FIG. 3. Via 220 is connected to path 221 and to via 325 of FIG. 3. Path 221 is connected to pad 222. Via 223 is also present in planar conductive layer 200 and is connected to via 315 of FIG. 3. Pads 211 and 217 are configured as a pair of pads across which a decoupling capacitor can be installed, for example, by depositing pads 211 and 217 so as to underlie a decoupling capacitor embedded in a planarized encapsulated assembly of electronic circuit elements. Pads 204 and 209 are configured as a pair of pads across which a matching capacitor can be installed, for example, by depositing pads 204 and 209 so as to underlie a decoupling capacitor embedded in a planarized encapsulated assembly of electronic circuit elements. Pad 209 is at a distal end of a planar coil having an opposite end coupled to balanced output terminal 411 of FIG. 4, where the distal end is distal with respect to the balanced output terminal 411. Pads 214 and 222 are configured as a pair of pads across which a matching capacitor can be installed, for example by depositing pads 214 and 222 so as to underlie a decoupling capacitor embedded in a planarized encapsulated assembly of electronic circuit elements. Pad 214 is at a distal end of a planar coil having an opposite end coupled to balanced output terminal 416 of FIG. 4, where the distal end is distal with respect to the balanced output terminal 416.

Figure 3:
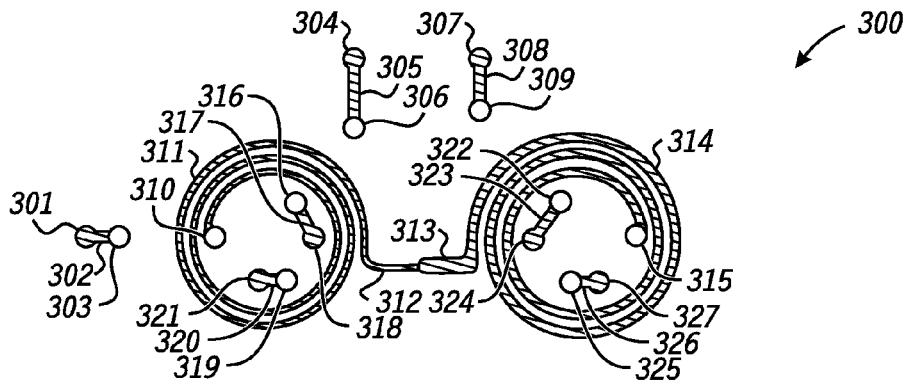
FIG. 3 is a plan view drawing illustrating a second layer of the balun of FIG. 1 in accordance with an embodiment.

FIG. 3 is a plan view drawing illustrating a second layer of the balun of FIG. 1 in accordance with an embodiment. In a planar conductive layer 300, a plurality of conductive features defined as described below. Via 301 is connected to path 302 and to via 402 of FIG. 4. Path 302 is connected to via 303. Via 303 is connected to via 201 of FIG. 2. Via 304 is connected to path 305 and to via 404 of FIG. 4. Path 305 is connected to via 306. Via 306 is connected to via 213 of FIG. 2. Via 307 is connected to path 308 and to via 406 of FIG. 4. Path 308 is connected to via 309. Via 309 is connected to via 219 of FIG. 2. Via 310 is connected to an input end of planar coil 311 and to via 203 of FIG. 2. An opposite end of planar coil 311 is connected to path 312. Path 312 is connected to path 313. Path 313 is connected to an opposite end of planar coil 314, wherein the opposite end of planar coil 314 is opposite a terminal end of planar coil 314. Via 315 is connected to planar coil 314 at the terminal end and to via 223 of FIG. 2. Via 316 is connected to path 317 and to via 207 of FIG. 2. Path 317 is connected to via 318. Via 318 is connected to pad 209 of FIG. 2 and to via 407 of FIG. 4. Via 319 is connected to path 320 and to via 206 of FIG. 2. Path 320 is connected to via 321. Via 321 is connected to via 418 of FIG. 4. Via 322 is connected to path 323 and to via 216 of FIG. 2. Path 323 is connected to via 324. Via 324 is connected to pad 214 of FIG. 2 and to via 412 of FIG. 4. Via 325 is connected to path 326 and to via 220 of FIG. 2. Path 326 is connected to via 327. Via 327 is connected to via 420 of FIG. 4.

As illustrated, planar coil 311 and path 312 can have a different width than planar coil 314 and path 313. As an example, path 313 can be wider than path 312, and planar coil 314 can be wider than planar coil 311.

Figure 4:
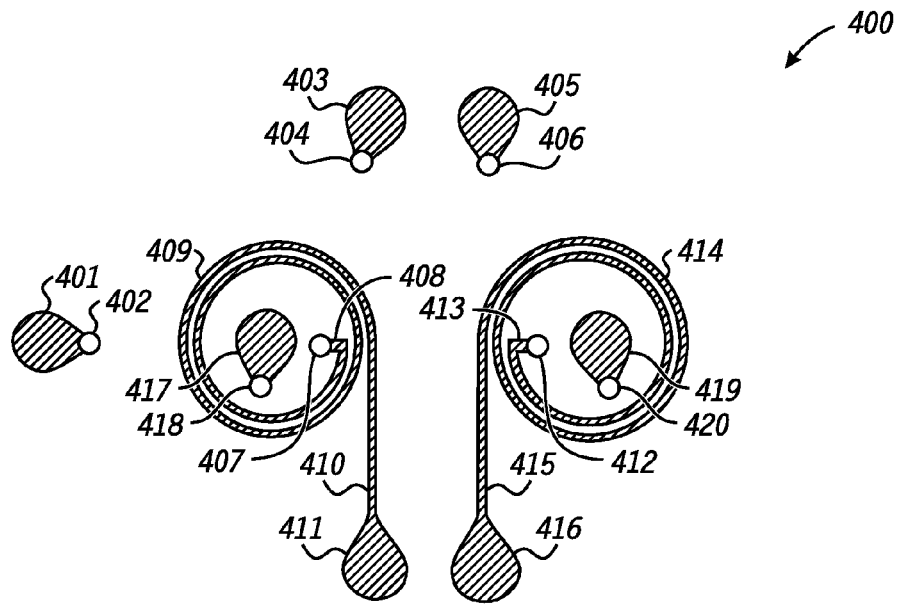
FIG. 4 is a plan view drawing illustrating a third layer of the balun of FIG. 1 in accordance with an embodiment.

FIG. 4 is a plan view drawing illustrating a third layer of the balun of FIG. 1 in accordance with an embodiment. In a planar conductive layer 400, a plurality of conductive features defined as described below. Terminal pad 401 is connected to via 402. Via 402 is connected to via 301 of FIG. 3. Terminal pad 403 is connected to via 404. Via 404 is connected to via 304 of FIG. 3. Terminal pad 405 is connected to via 406. Via 406 is connected to via 307 of FIG. 3. Via 407 is at a distal end of planar coil 409 with respect to terminal pad 411, which provides one output terminal of a balanced output. Via 407 is connected to path 408, to pad 318 of FIG. 3, and to pad 209 of FIG. 2. Path 408 is connected to the distal end of planar coil 409. Planar coil 409, at its proximal end with respect to terminal pad 411, is connected to path 410. Path 410 is connected to terminal pad 411. Via 412 is at a distal end of planar coil 414 with respect to terminal pad 416, which provides one output terminal of the balanced output. Together, terminal pad 411 and terminal pad 416 provide the two output terminals of the balanced output of the balun. Via 412 is connected to path 413, to via 324 of FIG. 3, and to pad 214 of FIG. 2. Path 413 is connected to the distal end of planar coil 414. Planar coil 414, at its proximal end with respect to terminal pad 416, is connected to path 415. Path 415 is connected to terminal pad 416. Terminal pad 417 is connected to via 418. Via 418 is connected to via 321 of FIG. 3. Terminal pad 419 is connected to via 420. Via 420 is connected to via 327 of FIG. 3.

Planar coils 311 and 314 are situated in planar conductive layer 300 and planar coils 409 and 414 are situated in planar conductive layer 400. Thus, elements such as vias 316, 318, 319, and 321 and paths 317 and 320 are understood to be within an interior of planar coil 311, elements such as vias 322, 324, 325, and 327 and paths 323 and 326 are understood to be within an interior of planar coil 314, elements such as via 418 and terminal pad 417 are understood to be within planar coil 409, and elements such as via 420 and terminal pad 419 are understood to be within planar coil 414. However, given the close spacing between planar conductive layers 200, 300, and 400, for example, between 5 and 20 microns, such as 14 microns, elements in planar conductive layer 200, such as pads 204 and 209, vias 206 and 207, and paths 205 and 208, are also understood to be within the interior of planar coils 311 and 409, and elements in planar conductive layer 200, such as pads 214 and 222, vias 216 and 220, and paths 215 and 221, are also understood to be within the interior of planar coils 314 and 414. The close spacing between planar conductive layers 200, 300, and 400 minimizes the length of conductive paths through the multilayer interposer of the integrated circuit package. By minimizing conductive paths to ground through the multilayer interposer, a low ground inductance is provided. Thus, a compact wideband balun exhibiting low ground inductance can be provided.

Figure 5:
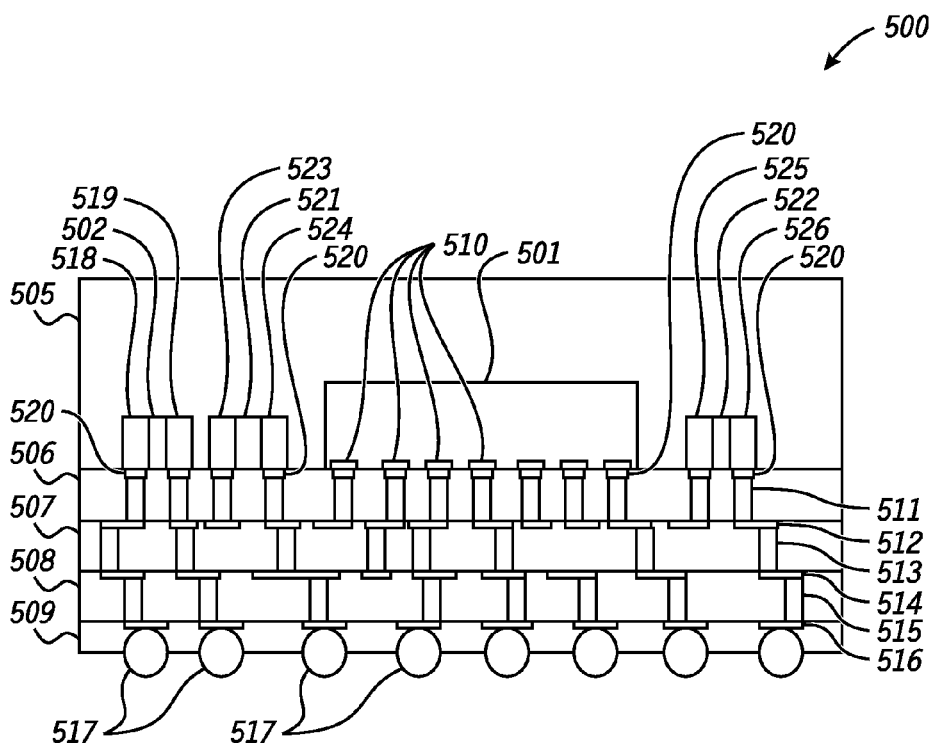
FIG. 5 is an elevation view drawing illustrating a balun implemented in build-up layers of a multi-layer interposer of an integrated circuit package in accordance with an embodiment.

FIG. 5 is an elevation view drawing illustrating a balun implemented in build-up layers of a multi-layer interposer of an integrated circuit package in accordance with an embodiment. Packaged integrated circuit 500 includes at least one semiconductor die 501. The semiconductor die 501 is connected via interconnects 510 to vias 511 of a multilayer interposer. In the illustrated example, the multilayer interposer includes a first layer, a second layer, a third layer, and a fourth layer. The first layer includes a first dielectric layer 506. As an example, the first layer includes a first conductive layer on an upper surface of first dielectric layer 506. According to such example, conductive features such as pads 520, ends of vias, and paths between pads, vias, and other features are defined in the first conductive layer. As another example, interconnection between features such as terminals 518 and 519 of surface mount technology (SMT) component 502, terminals 523 and 524 of SMT component 521, terminals 525 and 526 of SMT component 522, and features defined in the first conductive layer can be provided by conductive vias deposited in a dielectric layer overlying the first conductive layer and underlying capacitor 502. As an example, such conductive vias can be deposited by plating metal. Such vias can also provide interconnection to other features, such as interconnects 510 for semiconductor die 501, and other electronic components that can be provided, for example, in a planarized embedded assembly of encapsulated electronic circuit elements contained within encapsulant 505. According to such example, vias 511 can extend to interconnects 510, terminals 518 and 519, terminals 523 and 524, and terminals 525 and 526 without the need for pads 520 to be separately provided. The first layer includes vias 511 disposed in holes defined in first dielectric layer 506. The second layer includes a second dielectric layer 507. The second layer also includes a second conductive layer 512. Features such as planar coils, ends of vias, and paths between planar coils, vias, and other features are defined in second conductive layer 507. The second layer further includes vias 513 disposed in holes defined in second dielectric layer 507. The third layer includes a third dielectric layer 508. The third layer also includes a third conductive layer 514. Features such as planar coils, ends of vias, terminal pads, and paths between planar coils, vias, and terminal pads are defined in third conductive layer 514. The third layer further includes vias 515 disposed in holes defined in third dielectric layer 508. The fourth layer includes a fourth dielectric layer 509. The fourth layer also includes a fourth conductive layer 516. Features such as terminal pads, vias, and paths between terminal pads and vias are defined in fourth conductive layer 516. The fourth layer further includes conductive interconnects 517, for example, solder balls, disposed in holes defined in fourth dielectric layer 509. Where conductive elements of, for example, a lower surface of one layer, are in contact with conductive elements of, for example, an upper surface of a directly underlying layer, an electrical connection from the overlying layer to the underlying layer is provided. Where a non-conductive element, such as a dielectric layer, separates conductive elements, no electrical connection is provided along at least the non-conductively separated portions of the conductive elements.

Packaged integrated circuit 500 of FIG. 5 can include other circuit features provided in the planarized embedded assembly of encapsulated electronic circuit elements, and such features can be connected to vias 511. Elements of the packaged integrated circuit, such as semiconductor die 501, SMT components 502, 521 and 522 (such as a capacitors, for example, capacitors 614, 611, and 612 of FIG. 6) can be encapsulated in an encapsulant 505 (such as an epoxy) to house and provide environmental protection for such elements. It is noted that, to more clearly illustrate details, FIG. 5 is not drawn to scale.

Referring back to FIGS. 1-4, balun 100 can be fabricated by defining the pattern of first planar conductive layer 200, shown in FIG. 2, as the first conductive layer, shown in FIG. 5, by defining the pattern of second planar conductive layer 300, shown in FIG. 3, as second conductive layer 512, shown in FIG. 5, and by defining the pattern of third planar conductive layer 400, shown in FIG. 4, as third conductive layer 514, shown in FIG. 5. Vias between the first planar conductive layer 200, shown in FIG. 2, and the second planar conductive layer 300, shown in FIG. 3, can be implemented using vias 511, shown in FIG. 5. Vias between the second planar conductive layer 300, shown in FIG. 3, and the third planar conductive layer 400, shown in FIG. 4, can be implemented using vias 513, shown in FIG. 5. Features such as pads 211 and 217 of FIG. 2 for mounting a decoupling capacitor can be implemented, for example, using via 511 of FIG. 5, with the decoupling capacitor being implemented by surface mount technology (SMT) component 502 of FIG. 5. Thus, a balun 100 can be implemented in a multilayer interposer between a semiconductor die 501 and conductive interconnects 517 within packaged integrated circuit 500.

While elements can be described as overlying or underlying other elements, it should be understood that such terms are used with respect to a particular integrated circuit package orientation and that other integrated circuit package orientations can be practiced without departing from the described relationships. For example, as shown in FIG. 1, conductive planar layer 200 overlies conductive planar layer 300, and conductive planar layer 300 overlies conductive planar layer 400. As shown in FIG. 5, encapsulant 505 overlies semiconductor die 501 and SMT component 502, which both overlie a first layer of the multilayer interposer, which overlies a second layer of the multilayer interposer, which overlies a third layer of the multilayer interposer, which overlies conductive interconnects 517 of the packaged integrated circuit 500. It should be understood that, for example, if packaged integrated circuit 500 were oriented to be inverted relative to its orientation shown in FIG. 5, the relationships between the described succession of elements overlying one another would not physically differ despite the different orientation.

Figure 6:
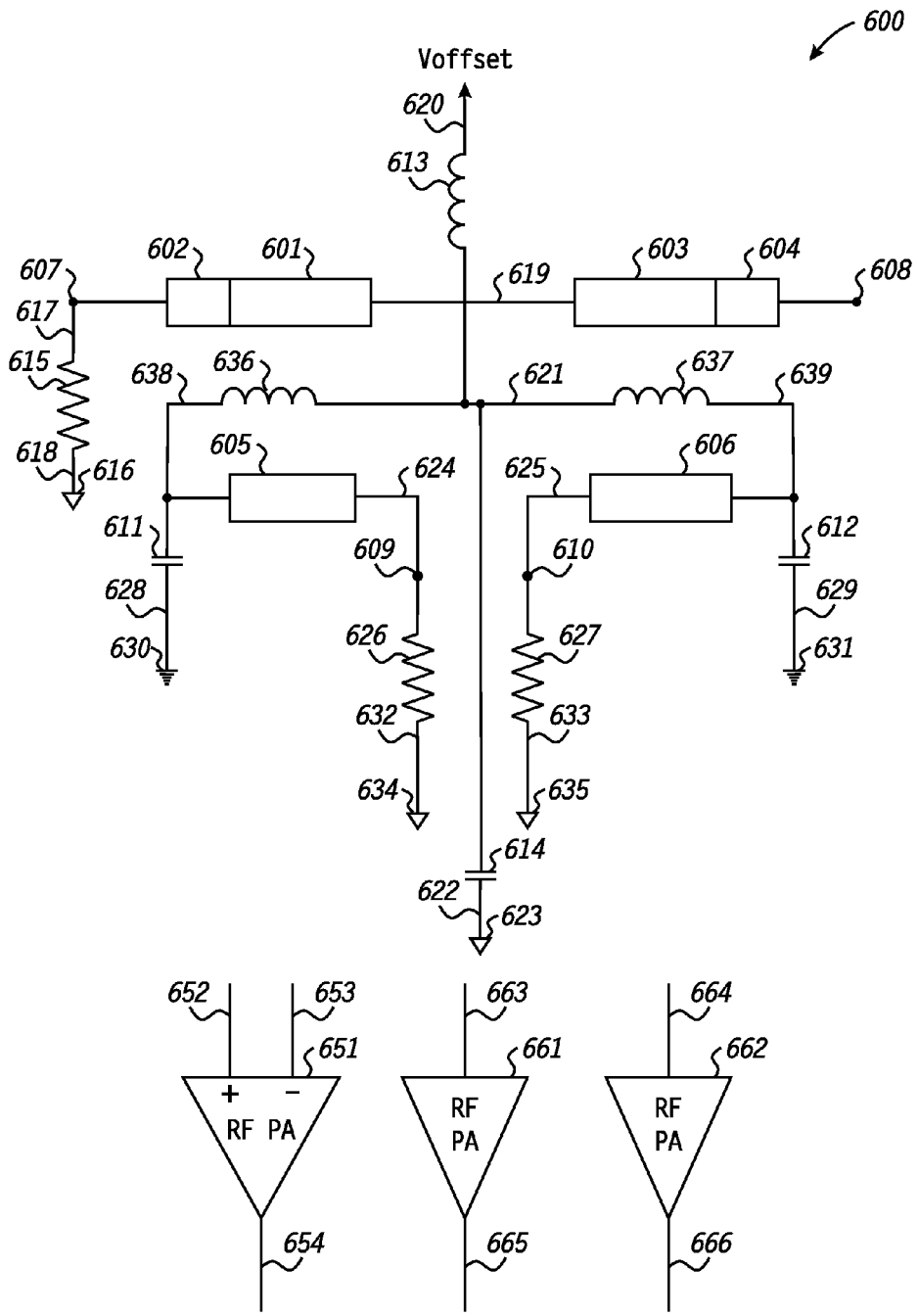
FIG. 6 is a schematic diagram illustrating a balun in accordance with an embodiment.

FIG. 6 is a schematic diagram illustrating a balun in accordance with an embodiment. Balun 600 includes a first input section having a first portion 601 and a second portion 602. Balun 600 includes a second input section in series with the first input section, the second input section having a first portion 603 and a second portion 604. Balun 600 includes a first output section 605 and a second output section 606. The first portion 601 of the first input section is electromagnetically coupled to first output section 605, for example, by implementing the first portion 601 of the first input section and the first output section 605 as stacked planar coils situated in different layers of the multilayer interposer. The second portion 602 of the first input section extends beyond the end of the first output section 605 so as to provide matching, such as impedance matching or phase matching but not tight coupling to the first output section 605. As an example, the matching can be provided to match an impedance or phase of first portion 601 of the first input section relative to unbalanced input terminal 607 at node 617. The second portion 604 of the second input section extends beyond the end of the second output section 606 so as to provide matching, such as impedance matching or phase matching, but not tight coupling to the second output section 606. As another example, the matching can be provided to match an impedance or phase of first portion 603 of the second input section relative to terminal 608.

An unbalanced input terminal 607 at node 617 is connected to an input end of the second portion 602 of the first input section. Impedance 615 coupled to ground 616 at node 618 represents the input impedance of the unbalanced input of balun 600. A medial end of the first portion 601 of the first input section is connected to a medial end of the first portion 603 of the second input section via path 619. A terminal end of the second portion 604 of the second input section is left open at terminal 608.

At node 638, the distal end of first output section 605 with respect to a first balanced output terminal is connected to a first end of inductance 636, which represents a parasitic inductance of a conductor, and to a first end of first lateral decoupling capacitor 611. A second end of first lateral decoupling capacitor 611 is connected to ground 630 at node 628. At note 639, a distal end of second output section 606 with respect to a second balanced output terminal is connected to a first end of inductance 637, which represents a parasitic inductance of a conductor, and to a first end of second lateral decoupling capacitor 612. A second end of second lateral decoupling capacitor 612 is connected to ground 631 at node 629. A second end of inductance 636 and a second end of inductance 637 are connected together via path 621, which is connected to an offset voltage Voffset at node 620 via inductance 613 and to a first end of common decoupling capacitor 614. A second end of common decoupling capacitor 614 is connected to ground 623 at node 622. A proximal end of first output section 605 at node 624 is connected to a first balanced output terminal 609. A proximal end of second output section 606 at node 625 is connected to a second balanced output terminal 610. A second end of first lateral decoupling capacitor 611 is connected to ground 630 at node 628. A second end of second lateral decoupling capacitor 612 is connected to ground 631 at node 629. Impedance 626 coupled to ground 634 at node 632 represents the output impedance of first balanced output terminal 609 of balun 600. Impedance 627 coupled to ground 635 at node 633 represents the output impedance of second balanced output terminal 610 of balun 600.

Lateral decoupling capacitor 611 can be considered to be internal, being situated within (e.g., overlying or underlying) an area occupied by stacked planar spiral coils 311 and 409 of FIGS. 3 and 4. Lateral decoupling capacitor 612 can be considered to be internal, being situated within (e.g., overlying or underlying) an area occupied by stacked planar spiral coils 314 and 414 of FIGS. 3 and 4. Common decoupling capacitor 614 can be considered to be external, being situated outside of (e.g., not overlying or underlying) the areas occupied by either of stacked planar spiral coils 311 and 409 or stacked planar spiral coils 314 and 414 of FIGS. 3 and 4. Lateral decoupling capacitor 611 can help provide matching for first output section 605 to compensate for the length of the interconnect along path 621 from the first end of common decoupling capacitor 614 to the distal end of first output section 605, for which a parasitic inductance, shown an inductance 636, exists. Lateral decoupling capacitor 612 can help provide matching for second output section 606 to compensate for the length of the interconnect along path 621 from the first end of common decoupling capacitor 614 to the distal end of second output section 606, for which a parasitic inductance, shown an inductance 637, exists.

As an example, first balanced output terminal 609 can be connected to a first differential input 652 of a radio frequency (RF) power amplifier (PA) 651, and second balanced output terminal 610 can be connected to a second differential input 653 of RF PA 651. RF PA 651 provides, for example, an unbalanced output 654. In such an example, impedance 626 represents the input impedance of first differential input 652 and impedance 627 represents the input impedance of second differential input 653.

As another example, first balanced output terminal 609 can be connected to a first RF PA input 663 of a first RF PA gain element 661, which provides a first RF PA output 665, and second balanced output terminal 610 can be connected to a second RF PA input 664 of a second RF PA gain element 662, which provides a second RF PA output 666. First RF PA output 665 and second RF PA output 666 provide a balanced RF output of the RF PA gain elements. In such an example, impedance 626 represents the input impedance of the first RF PA input 663 of the first RF PA gain element 661 and impedance 627 represents the input impedance of the second RF PA input 664 of the second RF PA gain element 662.

Figure 7:
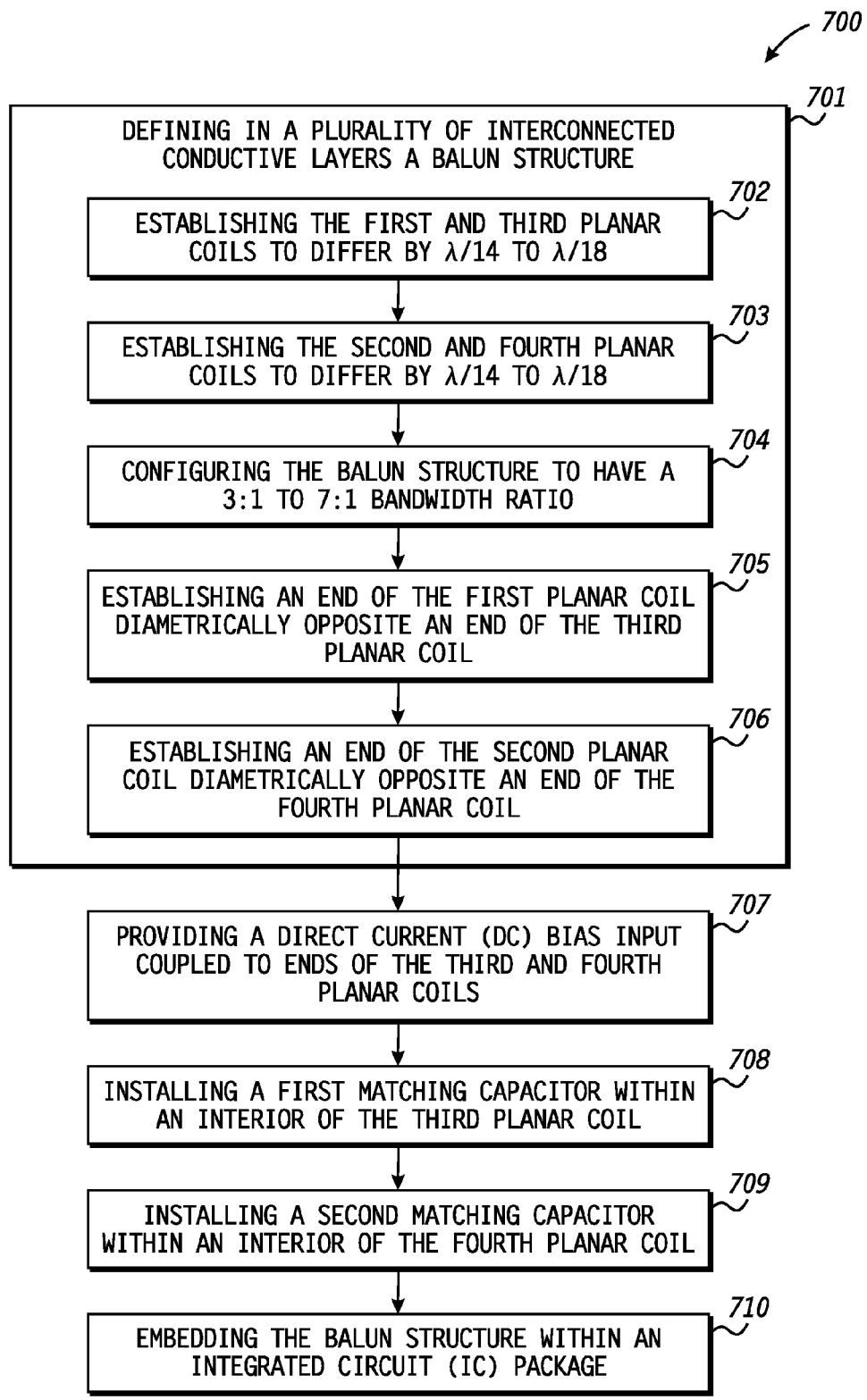
FIG. 7 is a flow diagram illustrating a method for manufacturing a balun in accordance with an embodiment.

FIG. 7 is a flow diagram illustrating a method for manufacturing a balun in accordance with an embodiment. Method 700 begins in block 701, where a balun structure having an unbalanced input terminal, a first planar coil coupled to the unbalanced input terminal, a second planar coil coupled to the first planar coil, a third planar coil stacked in relation to the first planar coil, a first balanced output terminal coupled to the third planar coil, a fourth planar coil stacked in relation to the second planar coil, and a second balanced output terminal coupled to the fourth planar coil is defined in a plurality of interconnected conductive layers. The interconnected conductive layers are separated by dielectric layers. A first length of the first planar coil and a third length of the third planar coil differ by one twelfth to one twentieth of an operational wavelength. A second length of the second planar coil and a fourth length of the fourth planar coil differ by one twelfth to one twentieth of the operational wavelength. Block 701 can include block 702. In block 702, the first length of the first planar coil and the third length of the third planar coil are established to differ by one fourteenth to one eighteenth of the operational wavelength. Block 701 can include block 703. In block 703, the second length of the second planar coil and the fourth length of the fourth planar coil are established to differ by one fourteenth to one eighteenth of the operational wavelength. Block 701 can include block 704. In block 704, the balun structure is configured to have an operational bandwidth expressed as a ratio of between three to one and seven to one of a highest operational frequency to a lowest operational frequency. Block 701 can include block 705. In block 705, an input end of the first planar coil is established to be diametrically opposite a distal end of third planar coil distal with respect to the first balanced output terminal. Block 701 can include block 706. In block 706, a terminal end of the second planar coil is established to be diametrically opposite a distal end of the fourth planar coil distal with respect to the second balanced output terminal.

From block 701, method 700 continues to block 707. In block 707, a direct current (DC) bias input coupled to ends of the third planar coil and the fourth planar coil opposite the first balanced output terminal and the second balanced output terminal, respectively, is provided. From block 707, method 700 continues to block 708. In block 708, a first matching capacitor situated within an interior of the third planar coil and coupled to an end of the third planar coil opposite the first balanced output terminal is installed. From block 708, method 700 continues to block 709. In block 709, a second matching capacitor situated within an interior of the fourth planar coil and coupled to an end of the fourth planar coil opposite the second balanced output terminal is installed. From block 709, method 700 continues to block 710. In block 710, the balun structure is embedded within an integrated circuit package, wherein the plurality of interconnected conductive layers underlie an integrated circuit die and overlie external interconnect terminals of the integrated circuit package.

In accordance with at least one embodiment, a balanced wideband balun with compensated offset capacitance and asymmetric metal layers is provided. The compensated offset capacitance can be provided by capacitive elements, such as capacitors, installed within an interior of planar coils defined in a multilayer interposer underlying a semiconductor die within an integrated circuit package. The asymmetric metal layers can be realized by defining stacked planar coils within different closely spaced planar conductive layers of the multilayer interposer, wherein a planar coil in one layer has a different length than the length of another planar coil in an adjacent layer with which it is stacked. By having a different length, a portion of the longer planar coil extends, in an unstacked manner, beyond the end of the shorter planar coil with which the stacked portion of the longer planar coil is stacked. For example, the unstacked portion of the longer planar coil can extend in an arc of more than 90 degrees and less than 270 degrees, for example, 180 degrees. As an example, the end of the shorter planer coil that defines one end of the unstacked portion of the longer planar coil can be diametrically opposite the other end of the unstacked portion of the longer planar coil. The stacked planar coils can be said to be asymmetric in that they are not of the same lengths. Asymmetry of the stacked planar coils can be used to compensate for asymmetry of the two output ports in a single to dual ended balun, realized within a packaged integrated circuit, due to parasitics. As an example, asymmetry of the stacked planar coils can be used to compensate for a phase difference between the two output ports. By providing such compensation, a closely balanced output over a wide bandwidth useful for many applications can be provided, and compact baluns fabricated within a packaged integrated circuit can be realized. By injecting a DC offset to the output portion of the balun, subsequent circuitry connected to the balanced output terminals of the balun can be provided with balanced signal portions having a DC offset, as may be desired in some situations.

In accordance with at least one embodiment, a compact integrated Marchand balun structure compatible with wide bandwidth radio frequency (RF) applications is provided. A stacked coupled balun structure can be implemented in multiple interconnect layers of a multilayer interposer of a packaged integrated circuit. By utilizing elements such as compensated offset capacitance and asymmetric metal layer features, as described above, improved symmetric output balance and wider band performance can be obtained.

Implementing refined balun features using a multilayer interposer within a packaged integrated circuit allows for surface-mount devices (SMD) like capacitors for tuning networks to be realized closer to the balun, limiting parasitic inductance. These capacitors can be imbedded in the process with only short via lengths and possible metal interconnect between the capacitors and the planar coils of the balun structure.

In accordance with at least one embodiment, improved signal balance can be obtained by using a common lower conductor width for both of the stacked planar coils, coupled to an input spiral with a top conductor that has a relatively smaller width and a second spiral with a top conductor that has a relatively larger width. The ratios can be modified and optimized for desired performance objectives.

In accordance with at least one embodiment, one conductor for the stacked planar coils extends about one sixteenth of a wavelength beyond the other conductor. Improved symmetry in the structure of the balun can be obtained through use of such an extended length, and the length should be adjusted so. The extended length can compensate for the parasitic lengths of the conductors, which can degrade the performance significantly more than the length of coil, which may not be denominated in specific increments in relation to wavelength. The spiral dimensions can be adjusted to accommodate a different center frequency, if desired, in order to compensate for symmetric design.

In accordance with at least one embodiment, a direct current (DC) offset can be introduced within the balun ground conductor as opposed to being added at the output. Due to the highly symmetric nature of the output section of the balun, a DC offset is possible to implement on the conductors of the output section of the balun.

In accordance with at least one embodiment, optimizations of metal interconnect widths and the asymmetric relationship of conductor lengths among stacked planar coils can provide improved balance in outputs. Furthermore, the close proximity and use of multiple levels of parasitic matching can be realized using a versatile conductive routing technology of small scale, such as a multilayer interposer within a packaged integrated circuit. A connection of ground within the interior of the stacked planar coils through vias, as opposed to a metal layer crossing the balun itself, can improve performance. While the balun is described using coupling features in the form of stacked planar coils, other coupling features can be implemented using the conductive layers of the multilayer interposer. For example, coupled lines, areas, or other geometric features can be used.

In accordance with at least one embodiment, a balun can be realized in close proximity to an active device for which the balun is provided. As an example, a balun can be realized immediately underlying a semiconductor die within a packaged integrated circuit. As an example, a balun can be provided for a radio frequency (RF) power amplifier (PA), for example, at an input to, or an output from, the RF PA. As a more specific example, a balun can be provided for a switched mode power amplifier (SMPA).

In accordance with at least one embodiment, the balun can be an unbalanced to balanced Marchand configuration balun having a coiled dual coupling element structure wherein one coupling element has an extra length of conductor relative to a coupling element to which it is electromagnetically coupled. The coupling elements can be, for example, planar coils, which can be, for example, a fully spiral structure. Differences in width of the metal features that define the electromagnetic coupling elements can be used to compensate for parasitics at the input for single ended to dual ended conversion, for example.

In accordance with at least one embodiment, the balun can be a balanced to unbalanced Marchand configuration balun having a coiled dual coupling element structure wherein one coupling element has an extra length of conductor relative to a coupling element to which it is electromagnetically coupled. The coupling elements can be, for example, planar coils, which can be, for example, a fully spiral structure. Differences in width of the metal features that define the electromagnetic coupling elements can be used to compensate for parasitics at the output for dual ended to single ended conversion, for example. A balanced to unbalanced balun can be implemented, for example, by receiving a balanced input signal at terminal pads 411 and 416 of FIG. 4 and providing an unbalanced output signal at terminal pad 401 of FIG. 4.

Accordingly, with reference to FIG. 6, a balanced input signal can be received at first balanced output terminal 609 and second balanced output terminal 610 of balun 600 and an unbalanced output signal can be provided at unbalanced input terminal 607 at node 617.

In accordance with at least one embodiment, a stacked planar Marchand spiral balun structure is provided. In accordance with at least one embodiment, a DC offset can be applied to endpoints of the output coupling elements distal with respect to the balanced output terminals. Using the ability to define a conductor in a different layer of a multilayer interposer, such endpoints of the output coupling elements of the balun can be symmetrically tied together to such a conductor to provide a common connection (common to both output coupling elements) through which to apply the DC offset.

In accordance with at least one embodiment, a balun structure comprises an unbalanced input terminal, a first planar coil coupled to the unbalanced input terminal, a second planar coil coupled to the first planar coil, a third planar coil stacked in relation to the first planar coil, a first balanced output terminal coupled to the third planar coil, a fourth planar coil stacked in relation to the second planar coil, and a second balanced output terminal coupled to the fourth planar coil, wherein a first length of the first planar coil and a third length of the third planar coil differ by one twelfth to one twentieth of an operational wavelength and a second length of the second planar coil and a fourth length of the fourth planar coil differ by one twelfth to one twentieth of the operational wavelength. In accordance with at least one embodiment, the first length of the first planar coil and the third length of the third planar coil differ by one fourteenth to one eighteenth of the operational wavelength, and the second length of the second planar coil and the fourth length of the fourth planar coil differ by one fourteenth to one eighteenth of the operational wavelength. In accordance with at least one embodiment, the balun structure has an operational bandwidth expressed as a ratio of between three to one and seven to one of a highest operational frequency to a lowest operational frequency. In accordance with at least one embodiment, the balun structure further includes a direct current (DC) bias input coupled to ends of the third planar coil and the fourth planar coil opposite the first balanced output terminal and the second balanced output terminal, respectively. In accordance with at least one embodiment, the balun structure further includes a first matching capacitor situated within an interior of the third planar coil and coupled to an end of the third planar coil opposite the first balanced output terminal and a second matching capacitor situated within an interior of the fourth planar coil and coupled to an end of the fourth planar coil opposite the second balanced output terminal. In accordance with at least one embodiment, the balun structure is embedded within an integrated circuit package and implemented on a multi-layer interposer structure underlying an integrated circuit die and overlying external interconnect terminals of the integrated circuit package. In accordance with at least one embodiment, an input end of the first planar coil is diametrically opposite a distal end of third planar coil distal with respect to the first balanced output terminal and a terminal end of the second planar coil is diametrically opposite a distal end of the fourth planar coil distal with respect to the second balanced output terminal.

In accordance with at least one embodiment, a method of manufacture comprises defining, in a plurality of interconnected conductive layers separated by dielectric layers, a balun structure having an unbalanced input terminal, a first planar coil coupled to the unbalanced input terminal, a second planar coil coupled to the first planar coil, a third planar coil stacked in relation to the first planar coil, a first balanced output terminal coupled to the third planar coil, a fourth planar coil stacked in relation to the second planar coil, and a second balanced output terminal coupled to the fourth planar coil, wherein a first length of the first planar coil and a third length of the third planar coil differ by one twelfth to one twentieth of an operational wavelength and a second length of the second planar coil and a fourth length of the fourth planar coil differ by one twelfth to one twentieth of the operational wavelength. In accordance with at least one embodiment, the defining further includes establishing the first length of the first planar coil and the third length of the third planar coil to differ by one fourteenth to one eighteenth of the operational wavelength and establishing the second length of the second planar coil and the fourth length of the fourth planar coil to differ by one fourteenth to one eighteenth of the operational wavelength. In accordance with at least one embodiment, the defining further includes configuring the balun structure to have an operational bandwidth expressed as a ratio of between three to one and seven to one of a highest operational frequency to a lowest operational frequency. In accordance with at least one embodiment, the method further includes providing a direct current (DC) bias input coupled to ends of the third planar coil and the fourth planar coil opposite the first balanced output terminal and the second balanced output terminal, respectively. In accordance with at least one embodiment, the method further includes installing a first matching capacitor situated within an interior of the third planar coil and coupled to an end of the third planar coil opposite the first balanced output terminal and installing a second matching capacitor situated within an interior of the fourth planar coil and coupled to an end of the fourth planar coil opposite the second balanced output terminal. In accordance with at least one embodiment, the method further includes embedding the balun structure within an integrated circuit package, wherein the plurality of interconnected conductive layers underlie an integrated circuit die and overlie external interconnect terminals of the integrated circuit package. In accordance with at least one embodiment, the defining further includes establishing an input end of the first planar coil to be diametrically opposite a distal end of third planar coil distal with respect to the first balanced output terminal and establishing a terminal end of the second planar coil to be diametrically opposite a distal end of the fourth planar coil distal with respect to the second balanced output terminal.

In accordance with at least one embodiment, a system includes a radio frequency (RF) power amplifier (PA) and a balun structure coupled to the RF PA. The balun structure includes an unbalanced input terminal, a first planar coil coupled to the unbalanced input terminal, a second planar coil coupled to the first planar coil, a third planar coil stacked in relation to the first planar coil, a first balanced output terminal coupled to the third planar coil, a fourth planar coil stacked in relation to the second planar coil, and a second balanced output terminal coupled to the fourth planar coil, wherein a first length of the first planar coil and a third length of the third planar coil differ by one twelfth to one twentieth of an operational wavelength and a second length of the second planar coil and a fourth length of the fourth planar coil differ by one twelfth to one twentieth of the operational wavelength. In accordance with at least one embodiment, the RF PA is a switched mode power amplifier (SMPA). In accordance with at least one embodiment, the balun structure further includes a direct current (DC) bias input coupled to ends of the third planar coil and the fourth planar coil opposite the first balanced output terminal and the second balanced output terminal, respectively. In accordance with at least one embodiment, the system further includes a first matching capacitor situated within an interior of the third planar coil and coupled to an end of the third planar coil opposite the first balanced output terminal and a second matching capacitor situated within an interior of the fourth planar coil and coupled to an end of the fourth planar coil opposite the second balanced output terminal. In accordance with at least one embodiment, the RF PA and the balun structure are embedded within an integrated circuit package with the balun structure implemented on a multi-layer interposer structure underlying the RF PA and overlying external interconnect terminals of the integrated circuit package. In accordance with at least one embodiment, an input end of the first planar coil is diametrically opposite a distal end of third planar coil distal with respect to the first balanced output terminal and a terminal end of the second planar coil is diametrically opposite a distal end of the fourth planar coil distal with respect to the second balanced output terminal.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A balun structure comprising:
   an unbalanced input terminal;
   a first planar coil coupled to the unbalanced input terminal;
   a second planar coil coupled to the first planar coil;
   a third planar coil stacked in relation to the first planar coil;
   a first balanced output terminal coupled to the third planar coil;
   a fourth planar coil stacked in relation to the second planar coil; and
   a second balanced output terminal coupled to the fourth planar coil, wherein a first length of the first planar coil and a third length of the third planar coil differ by one twelfth to one twentieth of an operational wavelength and a second length of the second planar coil and a fourth length of the fourth planar coil differ by one twelfth to one twentieth of the operational wavelength.

2. The balun structure of claim 1 wherein the first length of the first planar coil and the third length of the third planar coil differ by one fourteenth to one eighteenth of the operational wavelength and the second length of the second planar coil and the fourth length of the fourth planar coil differ by one fourteenth to one eighteenth of the operational wavelength.

3. The balun structure of claim 1 having an operational bandwidth expressed as a ratio of between three to one and seven to one of a highest operational frequency to a lowest operational frequency.

4. The balun structure of claim 1 further comprising:
a direct current (DC) bias input coupled to ends of the third planar coil and the fourth planar coil opposite the first balanced output terminal and the second balanced output terminal, respectively.

5. The balun structure of claim 1 further comprising:
a first matching capacitor situated within an interior of the third planar coil and coupled to an end of the third planar coil opposite the first balanced output terminal; and
a second matching capacitor situated within an interior of the fourth planar coil and coupled to an end of the fourth planar coil opposite the second balanced output terminal.

6. The balun structure of claim 1 wherein the balun structure is embedded within an integrated circuit package and implemented on a multi-layer interposer structure underlying an integrated circuit die and overlying external interconnect terminals of the integrated circuit package.

7. The balun structure of claim 1 wherein an input end of the first planar coil is diametrically opposite a distal end of third planar coil distal with respect to the first balanced output terminal and a terminal end of the second planar coil is diametrically opposite a distal end of the fourth planar coil distal with respect to the second balanced output terminal.

8. A method of manufacture comprising:
defining, in a plurality of interconnected conductive layers separated by dielectric layers, a balun structure having an unbalanced input terminal, a first planar coil coupled to the unbalanced input terminal, a second planar coil coupled to the first planar coil, a third planar coil stacked in relation to the first planar coil, a first balanced output terminal coupled to the third planar coil, a fourth planar coil stacked in relation to the second planar coil, and a second balanced output terminal coupled to the fourth planar coil, wherein a first length of the first planar coil and a third length of the third planar coil differ by one twelfth to one twentieth of an operational wavelength and a second length of the second planar coil and a fourth length of the fourth planar coil differ by one twelfth to one twentieth of the operational wavelength.

9. The method of claim 8 wherein the defining further comprises:
establishing the first length of the first planar coil and the third length of the third planar coil to differ by one fourteenth to one eighteenth of the operational wavelength; and
establishing the second length of the second planar coil and the fourth length of the fourth planar coil to differ by one fourteenth to one eighteenth of the operational wavelength.

10. The method of claim 8 wherein the defining further comprises:
configuring the balun structure to have an operational bandwidth expressed as a ratio of between three to one and seven to one of a highest operational frequency to a lowest operational frequency.

11. The method of claim 8 further comprising:
providing a direct current (DC) bias input coupled to ends of the third planar coil and the fourth planar coil opposite the first balanced output terminal and the second balanced output terminal, respectively.

12. The method of claim 8 further comprising:
installing a first matching capacitor situated within an interior of the third planar coil and coupled to an end of the third planar coil opposite the first balanced output terminal; and
installing a second matching capacitor situated within an interior of the fourth planar coil and coupled to an end of the fourth planar coil opposite the second balanced output terminal.

13. The method of claim 8 further comprising:
embedding the balun structure within an integrated circuit package, wherein the plurality of interconnected conductive layers underlie an integrated circuit die and overlie external interconnect terminals of the integrated circuit package.

14. The method of claim 8 wherein the defining further comprises:
establishing an input end of the first planar coil to be diametrically opposite a distal end of third planar coil distal with respect to the first balanced output terminal; and
establishing a terminal end of the second planar coil to be diametrically opposite a distal end of the fourth planar coil distal with respect to the second balanced output terminal.

15. A system comprising:
a radio frequency (RF) power amplifier (PA); and
a balun structure coupled to the RF PA, the balun structure comprising:
an unbalanced input terminal;
a first planar coil coupled to the unbalanced input terminal;
a second planar coil coupled to the first planar coil;
a third planar coil stacked in relation to the first planar coil;
a first balanced output terminal coupled to the third planar coil;
a fourth planar coil stacked in relation to the second planar coil; and
a second balanced output terminal coupled to the fourth planar coil, wherein a first length of the first planar coil and a third length of the third planar coil differ by one twelfth to one twentieth of an operational wavelength and a second length of the second planar coil and a fourth length of the fourth planar coil differ by one twelfth to one twentieth of the operational wavelength.

16. The system of claim 15 wherein the RF PA is a switched mode power amplifier (SMPA).

17. The system of claim 15 wherein the balun structure further comprises a direct current (DC) bias input coupled to ends of the third planar coil and the fourth planar coil opposite the first balanced output terminal and the second balanced output terminal, respectively.

18. The system of claim 15 further comprising:
a first matching capacitor situated within an interior of the third planar coil and coupled to an end of the third planar coil opposite the first balanced output terminal; and
a second matching capacitor situated within an interior of the fourth planar coil and coupled to an end of the fourth planar coil opposite the second balanced output terminal.

19. The system of claim 15 wherein the RF PA and the balun structure are embedded within an integrated circuit package with the balun structure implemented on a multi-layer interposer structure underlying the RF PA and overlying external interconnect terminals of the integrated circuit package.

20. The system of claim 15 wherein an input end of the first planar coil is diametrically opposite a distal end of third planar coil distal with respect to the first balanced output terminal and a terminal end of the second planar coil is diametrically opposite a distal end of the fourth planar coil distal with respect to the second balanced output terminal.

* * * * *